United States Patent
Hunzeker et al.

(10) Patent No.: US 6,766,157 B1
(45) Date of Patent: Jul. 20, 2004

(54) REDUCING LO LEAKAGE IN A DIRECT CONVERSION RECEIVER QUADRATURE STAGE

(75) Inventors: Darin Hunzeker, San Diego, CA (US); Ralph Kaufman, La Mesa, CA (US)

(73) Assignee: Kyocera Wireless Corp., San Diego, CA (US)

( * ) Notice: Subject to any disclaimer, the term of this patent is extended or adjusted under 35 U.S.C. 154(b) by 531 days.

(21) Appl. No.: 09/754,104

(22) Filed: Jan. 3, 2001

(51) Int. Cl.[7] .................................................. H04B 1/10
(52) U.S. Cl. ...................... 455/317; 455/316; 455/318; 455/325
(58) Field of Search .......................... 455/317, 313–316, 455/304, 318, 302, 323, 324, 296, 310, 232.1, 234.1, 334.2, 303; 375/324, 345, 316, 328, 329, 334, 335

(56) References Cited

U.S. PATENT DOCUMENTS

| | | | | | |
|---|---|---|---|---|---|
| 5,613,233 A | * | 3/1997 | Vagher | ....................... | 455/296 |
| 5,708,399 A | * | 1/1998 | Fujii et al. | ................... | 332/103 |
| 5,850,598 A | * | 12/1998 | Behrent | ....................... | 455/324 |
| 5,862,455 A | * | 1/1999 | Martin et al. | .............. | 455/67.7 |
| 5,950,119 A | * | 9/1999 | McGeehan et al. | ......... | 455/302 |
| 6,016,422 A | * | 1/2000 | Bartusiak | ...................... | 455/76 |
| 6,018,553 A | * | 1/2000 | Sanielevici et al. | ......... | 375/334 |
| 6,029,059 A | * | 2/2000 | Bojer | .......................... | 455/326 |
| 6,073,001 A | * | 6/2000 | Sokoler | ....................... | 455/323 |
| 6,169,463 B1 | * | 1/2001 | Mohindra et al. | .......... | 332/104 |
| 6,192,225 B1 | * | 2/2001 | Arpaia et al. | ............ | 455/196.1 |
| 6,226,509 B1 | * | 5/2001 | Mole et al. | ................. | 455/302 |
| 6,282,413 B1 | * | 8/2001 | Baltus | ........................ | 455/260 |
| 6,343,211 B1 | * | 1/2002 | Thodesen et al. | ........... | 455/317 |
| 6,449,471 B1 | * | 9/2002 | Katsura et al. | ............. | 455/324 |
| 6,510,313 B1 | * | 1/2003 | Rapeli | ........................ | 455/323 |
| 6,516,185 B1 | * | 2/2003 | MacNally | ................ | 455/234.1 |
| 6,516,186 B1 | * | 2/2003 | Yamagishi et al. | ......... | 455/302 |
| 6,560,448 B1 | * | 5/2003 | Baldwin et al. | .......... | 455/234.1 |
| 6,574,462 B1 | * | 6/2003 | Strange | ...................... | 455/318 |

* cited by examiner

Primary Examiner—Pablo N. Tran

(57) ABSTRACT

An LO leakage canceller for a direct conversion receiver is disclosed. The canceller includes an RF input stage operating to provide at least two input signals, a local oscillator, an in-phase processor, and a quadrature processor. The local oscillator is configured to produce at least two reference signals for modulating the two input signals. Each of the in-phase and quadrature processors includes two consecutive quadrature splitters operating to substantially reduce leakage of the reference signal from the local oscillator to the RF input stage.

15 Claims, 2 Drawing Sheets

REDUCING LO LEAKAGE IN A DIRECT CONVERSION RECEIVER QUADRATURE STAGE

BACKGROUND

The present disclosure generally relates to direct conversion receivers used in telecommunication or data communication devices, and more specifically, to a local oscillator ("LO") leakage signal canceller in such a receiver.

Wireless communication systems often require a frequency converter to translate the high frequency input signal to a lower frequency for further processing. This may be accomplished by mixing the input with a locally-generated frequency source. One approach to wireless reception may utilize direct conversion of the high frequency input signal to baseband. Direct converters translate the RF input directly to baseband with zero intermediate frequency. Since there are no intermediate frequencies, many filters may be omitted or simplified. Therefore, it may be desirable to use such direct converters in mobile cellular communications.

A common problem encountered in direct conversion receivers is the effective LO leakage isolation. Since frequency mixers have finite LO to RF isolation, some of the LO signal appears at the receiver input and may be observed at the antenna. If there is inadequate filtering, the magnitude of this re-radiated signal may exceed the limit set by regulatory agencies, such as Federal Communications Commission (FCC). Furthermore, the signal may have a detrimental effect on receiver performance since any LO leakage into the antenna may downconvert through the mixer to produce a spurious reception response. Such LO leakage is of a particular problem in direct conversion receivers because the leakage signal is at the same frequency as that of the input signal, and thus cannot be filtered.

In direct conversion receivers, the LO leakage can downconvert and contribute to a troublesome dc offset in the baseband section of the receiver. This offset appears in the middle of the downconverted signal spectrum, and may be larger than the signal itself and significantly larger than thermal and flicker noise. Thus, the LO leakage signal in the direct conversion receiver may operate to jam other nearby subscriber units. Furthermore, the LO leakage may cause unintended radiation to exceed FCC specifications.

SUMMARY

The present disclosure describes a quadrature downconverter for a direct conversion receiver. The design of the downconverter is optimized to significantly reduce LO leakage signal leaking from the local oscillator through the RF section to the antenna.

The quadrature downconverter includes an RF input element, at least first and second quadrature splitters, a local oscillator, and at least two sets of mixers. The RF input element is configured to provide at least first and second RF inputs. The first and second quadrature splitters are configured to receive the first and second RF inputs and provide at least first and second in-phase RF outputs and at least first and second quadrature RF outputs.

The local oscillator operates to provide at least first and second reference signals. Each reference signal has an in-phase reference output and a quadrature reference output. Each set of mixers has at least first and second mixers. The first mixers are configured to modulate the first or second in-phase RF output with the in-phase reference output to produce in-phase baseband signals. The second mixers are configured to modulate the first or second quadrature RF output with the quadrature reference output to produce quadrature baseband signals. The quadrature splitters and the reference outputs operate to substantially reduce any local oscillator leakage signal leaking into the RF input element.

BRIEF DESCRIPTION OF THE DRAWINGS

Different aspects of the disclosure will be described in reference to the accompanying drawings wherein.

DETAILED DESCRIPTION

Figure 1:
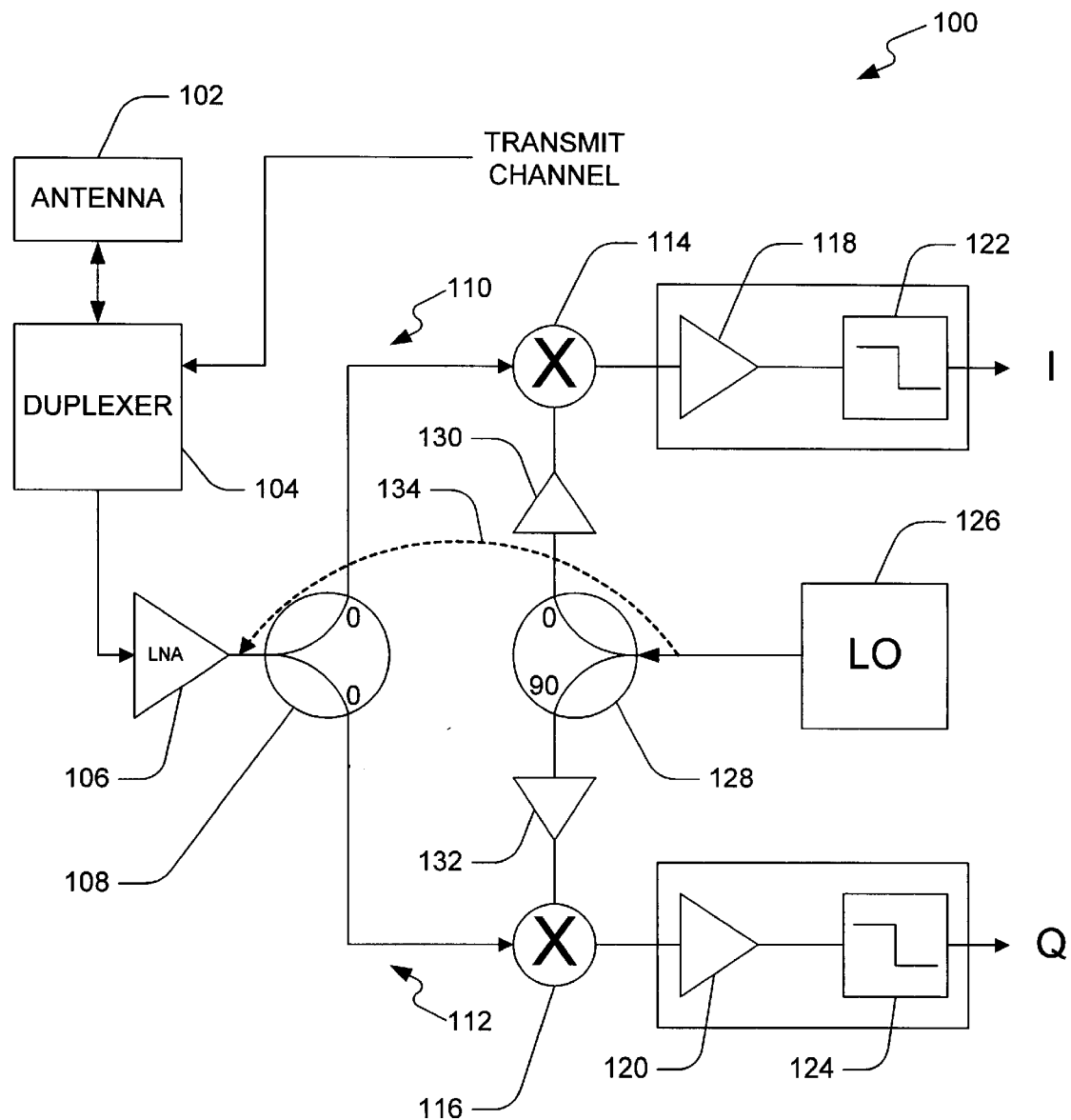
FIG. 1 shows a conventional direct conversion receiver utilizing quadrature modulation.

A conventional direct conversion receiver 100 utilizing quadrature modulation is shown in FIG. 1. An antenna 102 receives electromagnetic energy transmitted from a transmitter (not shown). The received signal is fed to a bandpass filter, which is designated as a duplexer 104. The designation serves to highlight the purpose of the duplexer 104 as a filter for both receive and transmit channels. A receive portion of the duplexer 104 provides for selection of the correct communication band to improve the blocking characteristics of the receiver 100. Strong signals outside of the receiver band are attenuated and therefore do not degrade the receiver performance.

An output of the duplexer 104 is connected to a low noise amplifier (LNA) 106 that improves the sensitivity of the receiver. The amplifier gain of the LNA 106 may be selected in view of actual requirements. A high gain results in good sensitivity, and low gain is desirable to achieve a good dynamic range and proper intermodulation characteristics. An output of the LNA 106 is split into two channels for quadrature processing, namely an I-channel 110 and a Q-channel 112. In the illustrated embodiment, the LNA 106 output is split into the two channels by a power splitter 108 for proper matching and power division.

Each of the I-channel 110 and Q-channel 112 is connected to a mixer 114, 116, respectively. The mixers 114, 116 convert the high frequency input signal to base band where it is easier to amplify and filter the signal with amplifiers 118, 120 and low pass filters 122, 124.

The mixers 114, 116 can be passive or active, and the choice between the two depends mostly on the intended application. Passive mixers have good large signal performance and a high third-order intercept point but suffer from high conversion losses and the need for a strong local oscillator signal. Therefore, such mixers are avoided in battery-powered equipment. An active mixer has a high conversion gain, can be driven by a low power local oscillator but instead has a lower third order intercept point and a slightly poorer noise figure than the passive mixer.

In a direct conversion receiver, a local oscillator signal may be at the same frequency as the received input signal. The signal from a local oscillator 126 may be split into two quadrature reference signals that are 90° apart by a quadrature splitter 128. The outputs of the quadrature splitter 128 are then amplified by amplifiers 130, 132, and the amplified signals are provided to the mixers 114, 116. Those outputs constitute second inputs to the mixers 114, 116, and operate to provide in-phase and quadrature input signals at the baseband.

When the circuit of FIG. 1 is in operation, there may be a leakage signal with the same frequency and some arbitrary phase shift relative to the local oscillator ("LO") 126. This signal may leak across the mixers 114, 116, the amplifier 106, and the duplexer 104, into the antenna 102 as shown in 134.

The signal may leak from the LO 126 through the power splitter 128 into the mixers 114, 116. The split signals impinging on the mixers 114, 116 pass through to the RF inputs at levels described by the mixers' LO to RF isolation specification. These signals then sum at the power splitter 108, and pass through the LNA 106 at a level described by its reverse isolation specification. The summed signal then easily passes through the duplexer 104 and gets applied to the antenna 102 as shown 134. The mixers 114, 116 and the duplexer 104 may reduce the level of the leakage signal somewhat, however, substantial portion of the LO leakage signal may pass through to the antenna 102.

Figure 2:
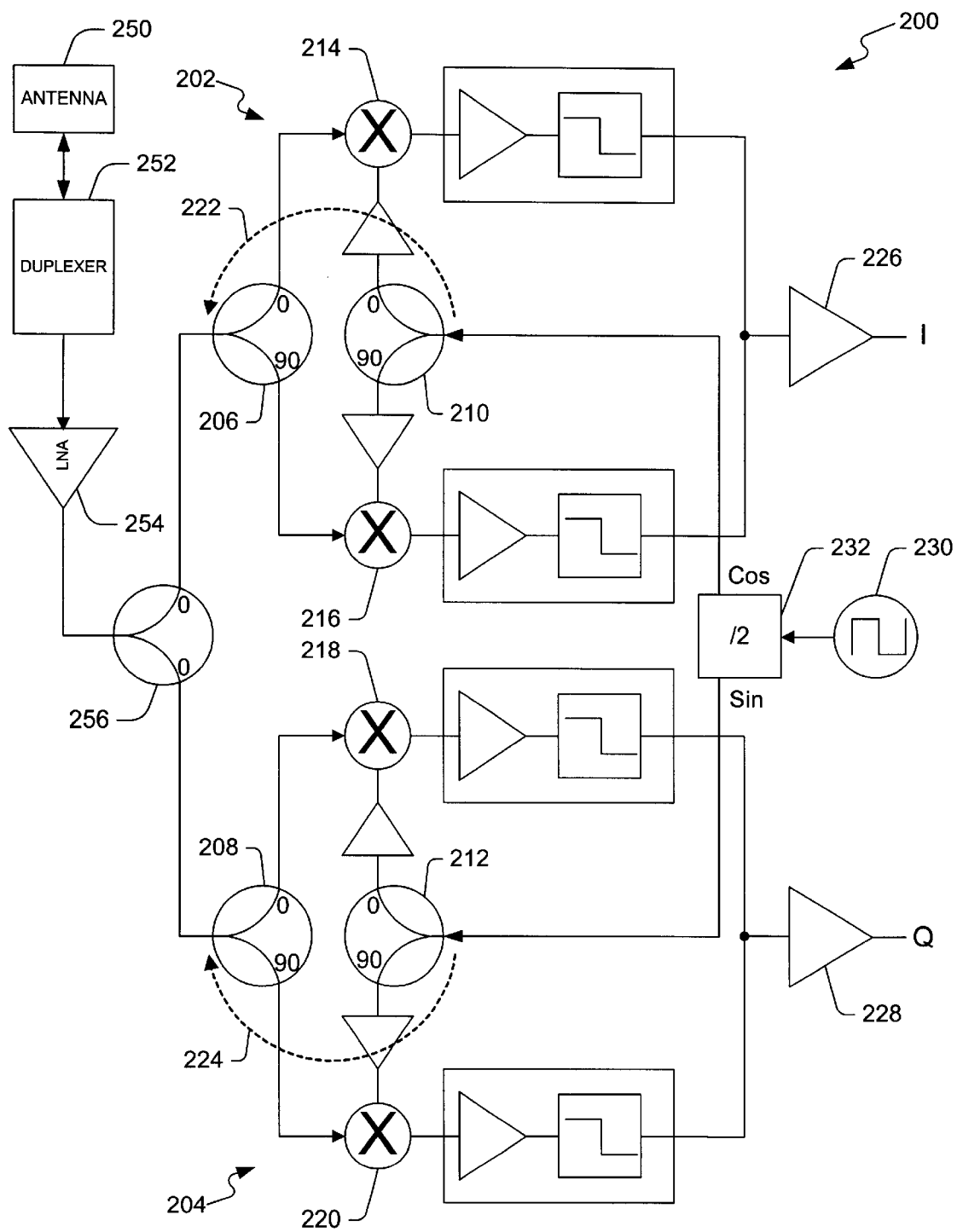
FIG. 2 illustrates an embodiment of the LO leakage cancellation system.

FIG. 2 illustrates an embodiment of the present disclosure, which is configured to significantly reduce the LO leakage signal. In the illustrated embodiment, the quadrature stage of the direct conversion receiver is configured to reduce the LO leakage signal by effectively canceling the LO leakage signal. The cancellation is premised on a fact that two signals that differ in phase by 180° cancel each other and produce a zero result if they are added together.

In the configuration of FIG. 2, an RF signal is received at an antenna 250 and is directed to a bandpass filter, which is designated as a duplexer 252. An output of the duplexer 252 is connected to a low noise amplifier (LNA) 254 that improves the sensitivity of the receiver. The amplified RF signal is then split into two channels, I-and Q-channels 202, 204, by a power splitter 256. I-and Q-channels 202, 204 are independently processed with quadrature LO signals by multiplying the input with quadrature LO signals in mixers 214, 216, 218, 220.

The LO signals are split in quadrature through a second set of quadrature splitters 210, 212. Each of the quadrature splitters 210, 212 produces two signals, one with no phase shift and another with 90° phase shift. The LO signals leak across the LO/mixer isolation as shown in 222, 224. The LO leakage signals are then summed in the first set of quadrature splitters 206, 208. The signal routed through the 0° phase shift is summed with the signal routed through the two successive 90° phase shifts. The two 90° phase shifts generated in the successive quadrature splitters 210, 206 or 212, 208 serve to produce signals that are 180° out of phase. Two signals that differ in phase by 180° cancel each other and produce a zero result if they are added together. Thus the summing of the two signals, one with no phase shift and another with 180° phase shift, at the power splitter 256 will substantially reduce the LO leakage signals leaking back through the LNA and the duplexer 252 into the antenna 250. Therefore, the LO leakage signals across the LO to RF isolation are canceled.

Op amp 226 recombines the quadrature components making up the I channel. Op amp 228 recombines the quadrature components making up the Q channel.

The local oscillator 230 provides a reference signal for the system. Since two reference signals are required in the illustrated configuration, the LO signal may be split in a frequency divider 232 to produce two signals that are ½pulse shifted. In the illustrated embodiment, the cosine signal is directed to the I-channel 202 and the sine signal is directed to the Q-channel 204.

One of the advantages of using the above-described LO leakage rejection system in direct conversion receivers includes the increase of up to 30 dB or more rejection of the LO leakage. This increase may reduce the size, cost, and complication of the rest of the components in the system.

While specific embodiments of the invention have been illustrated and described, other embodiments and variations are possible. For example, although the present disclosure has been described in terms of a wireless cellular system, the LO leakage cancellation design may be used in other systems such as portable cellular phones, cordless phones, pagers, carrier frequency systems, TV cable systems, and other related systems that include direct conversion receivers.

All these are intended to be encompassed by the following claims.

What is claimed is:

1. A quadrature downconverter for a direct conversion receiver, said downconverter comprising:
    an RF input element configured to provide at least first and second RF inputs;
    at least first and second quadrature splitters configured to receive said at least first and second RF inputs respectively, and to provide at least first and second in-phase RF outputs and at least first and second quadrature RF outputs;
    a local oscillator operating to provide at least first and second reference signals, each reference signal having an in-phase reference output and a quadrature reference output; and
    at least two sets of mixers, each set having at least first and second mixers, said first mixers of each mixer set modulating said first and said second in-phase RF output with said in-phase reference output respectively to produce in-phase baseband signals, and said second mixers of each mixer set modulating said first and said second quadrature RF output with said quadrature reference output respectively to produce quadrature baseband signals,
    where said at least first and second quadrature splitters and said reference outputs cooperate to substantially reduce any local oscillator leakage signal leaking into said RF input element.

2. The quadrature downconverter of claim 1, further comprising:
    at least two quadrature splitters coupled to said local oscillator, each of said at least two quadrature splitters operating to provide said in-phase and quadrature reference outputs for said each reference signal.

3. The quadrature downconverter of claim 2, wherein said in- phase and quadrature reference outputs are phase shifted by 90 degrees.

4. The quadrature downconverter of claim 2, wherein said at least first and second in-phase RF outputs and said in-phase reference output produce a first local oscillator leakage signal having 0° phase shift, and said at least first and second quadrature RF outputs and said quadrature reference output produce a second local oscillator leakage signal having 180° phase shift, where said at least first and second quadrature splitters operate to sum said first and second local oscillator leakage signals, which substantially reduces said first and second local oscillator leakage signal.

5. The quadrature downconverter of claim 1, wherein said in-phase RF outputs and said quadrature RF outputs are phase shifted by 90 degrees.

6. The quadrature downconverter of claim 1, further comprising:

a power splitter coupled to said RF input element, said power splitter operating to provide said at least first and second RF inputs having substantially similar power.

7. An LO leakage canceller for a direct conversion receiver, said canceller comprising:

an RF input stage operating to provide at least two input signals;

a local oscillator configured to produce at least two reference signals for modulating said at least two input signals, said at least two reference signals representing an in-phase signal and a quadrature signal;

an in-phase processor configured to produce an in-phase baseband signal, said in-phase processor including two quadrature splitters cooperating to substantially reduce leakage of one of said at least two reference signals from said local oscillator to said RF input stage; and a quadrature processor configured to produce a quadrature baseband signal, said quadrature processor including two quadrature splitters cooperating to substantially reduce leakage of another of said at least two reference signals from said local oscillator to said RF input stage.

8. The LO leakage canceller of claim 7, wherein said local oscillator includes a reference quadrature splitter.

9. The LO leakage canceller of claim 8, wherein said reference quadrature splitter produces an in-phase reference signal and a quadrature reference signal.

10. The LO leakage canceller of claim 9, wherein said in-phase and quadrature reference signals are phase shifted by 90 degrees.

11. The LO leakage canceller of claim 7, wherein said in-phase processor includes:

an RF quadrature splitter configured to cancel said leakage by summing a leakage signal with no phase shift with a leakage signal with 180° phase shift.

12. The LO leakage canceller of claim 7, wherein said quadrature processor includes:

an RF quadrature splitter configured to cancel said leakage by summing a leakage signal with no phase shift with a leakage signal with 180° phase shift.

13. A direct conversion receiver, comprising:

a duplexer configured to pass RF signal within a specified band of frequency;

a low-noise amplifier coupled to said duplexer, and operating to amplify said RF signal, said amplifier providing at least two input signals;

a local oscillator configured to produce at least two reference signals for modulating said at least two input signals, said at least two reference signals representing an in-phase signal and a quadrature signal;

an in-phase processor configured to produce an in-phase baseband signal, said in-phase processor including two quadrature splitters cooperating to substantially reduce leakage of one of said at least two reference signals from said local oscillator to said RF input stage; and a quadrature processor configured to produce a quadrature baseband signal, said quadrature processor including two quadrature splitters cooperating to substantially reduce leakage of another of said at least two reference signals from said local oscillator to said RF input stage.

14. The direct conversion receiver of claim 13, wherein said in-phase processor includes:

an RF quadrature splitter configured to cancel said leakage by summing a leakage signal with no phase shift with a leakage signal with 180° phase shift.

15. The direct conversion receiver of claim 13, wherein said in-phase processor includes:

an RF quadrature splitter configured to cancel said leakage by summing a leakage signal with no phase shift with a leakage signal with 180° phase shift.

* * * * *